United States Patent
Verheijden et al.

(10) Patent No.: US 8,980,698 B2
(45) Date of Patent: Mar. 17, 2015

(54) MEMS DEVICES

(75) Inventors: Greja Johanna Adriana Verheijden, Riethoven (NL); Gerhard Koops, Aalst (BE)

(73) Assignee: NXP, B.V., Eindhoven (NL)

( * ) Notice: Subject to any disclaimer, the term of this patent is extended or adjusted under 35 U.S.C. 154(b) by 253 days.

(21) Appl. No.: 13/128,202

(22) PCT Filed: Nov. 10, 2009

(86) PCT No.: PCT/IB2009/054998
§ 371 (c)(1),
(2), (4) Date: May 6, 2011

(87) PCT Pub. No.: WO2010/052684
PCT Pub. Date: May 14, 2010

(65) Prior Publication Data
US 2011/0210435 A1    Sep. 1, 2011

(30) Foreign Application Priority Data

Nov. 10, 2008    (EP) .................................... 08105755

(51) Int. Cl.
*H01L 21/00*    (2006.01)
*B81C 1/00*    (2006.01)

(52) U.S. Cl.
CPC ..... *B81C 1/00333* (2013.01); *B81C 2203/0136* (2013.01); *B81C 2203/0145* (2013.01)
USPC ............................... 438/125; 438/51; 438/52

(58) Field of Classification Search
USPC .............................................. 438/51, 52, 125
See application file for complete search history.

(56) References Cited

U.S. PATENT DOCUMENTS

| | | |
|---|---|---|
| 5,130,276 A | 7/1992 | Adams et al. |
| 5,258,097 A | 11/1993 | Mastrangelo |
| 5,834,332 A | 11/1998 | Hierold et al. |
| 7,138,293 B2 | 11/2006 | Ouelet et al. |
| 7,303,934 B2 | 12/2007 | Van Beek et al. |
| 7,368,313 B2 | 5/2008 | Benzel et al. |
| 7,381,583 B1 | 6/2008 | Ebel et al. |
| 2005/0036269 A1* | 2/2005 | Ma et al. ..................... 361/301.1 |
| 2007/0224832 A1* | 9/2007 | Zurcher ........................ 438/758 |
| 2008/0101113 A1* | 5/2008 | Park .............................. 365/166 |

FOREIGN PATENT DOCUMENTS

| | | |
|---|---|---|
| CN | 1657401 A | 8/2005 |
| CN | 1708450 A | 12/2005 |
| EP | 1 803 684 A2 | 7/2007 |

OTHER PUBLICATIONS

Witvrouw, A., et al. "A Comparison Between Wet HF Etching and Vapor HF Etching for Sacrificial Oxide Removal," Proc. SPIE 4174, 130, pp. 130-141 (2000).

(Continued)

*Primary Examiner* — Jae Lee

(57) ABSTRACT

A method of manufacturing a MEMS device comprises forming a MEMS device element 14. A sacrificial layer 20 is provided over the device element and a package cover layer 24 is provided over the sacrificial layer. A spacer layer 13 is formed over the sacrificial layer and is etched to define spacer portions adjacent an outer side wall of the sacrificial layer. These improve the hermetic sealing of the side walls of the cover layer 24.

19 Claims, 2 Drawing Sheets

(56) References Cited

OTHER PUBLICATIONS

He, R., et al. "On-Chip Hermetic Packaging Enabled by Post-Deposition Electrochemical Etching of Polysilicon", 18th IEEE Int'l. Conf. on Micro Electro Mechanical Systems, pp. 544-547 (2005).

Verheijden, G., et al. "Wafer Level Encapsulation Technology for MEMS Devices Using an HF-Permeable PECVD SIOC Capping Layer", 21st. IEEE Int'l. Conf. on Micro Electro Mechanical Systems (Jan. 2008).

Du Bois, B., et al. "HF Etching of Si—Oxides and Si—Nitrides for Surface Micromachining", Proc. of the Sensor Technology Conf., retrieved from the Internet www.primaxxinc.com/products/literature/Si-oxides__and__Si-nitrides.pdf, 6 pgs. (2001).

International Search Report and Written Opinion for Int'l. Patent Application No. PCT/IB2009/054998 (Dec. 22, 2010).

* cited by examiner

MEMS DEVICES

This invention relates to MEMS devices, and in particular to the formation of packaged devices.

MEMS technologies are increasingly being used in integrated circuits. However, numerous product concepts have not been implemented in practice as a result of difficulties providing suitable and cost effective packaging. Because MEMS devices are fragile as a result of the moving parts, and the device performance is affected by impurities, they have to be protected by such packaging both for the final use of the device but also during wafer dicing and bonding (when individual devices are separated from a substrate on which an array of devices has been formed).

There are many contributing factors to the high costs in packaging of MEMS devices and systems. The three principal factors are:
- proper packaging and efficient assembly of parts and components of sizes less than a few millimeters for MEMS system, with complex geometries, requires special tools and fixtures.
- the high diversity of MEMS devices and systems makes requirements for reliable packaging vary significantly from one product to another. For example, vacuum packing for hermetic sealing is a necessity in many cases.
- the small size of parts and components in MEMS devices and systems creates many unique problems in both packaging and assembly.

There are a number of techniques used for encapsulating MEMS devices:
- use of off-the-shelf packages and careful handling techniques;
- attachment of a separate cap, usually glass or silicon, on top of a finished MEMS device part;
- integrated wafer level encapsulation.

The selection of off-the-shelf components is a costly and time-consuming process.

The use of a separate cap requires a capping wafer, which typically comprises a pre-fabricated cavity formed of glass or silicon. Anodic of frit glass bonding is then used, because of the back-end compatible process temperatures (400° C.) in preference to fusion bonding at much higher temperatures (1000° C.). A vacuum inside the cavity can be achieved if the bonding is performed in a vacuum chamber. This approach requires wafer bonding and flip-chip alignment equipment.

An integrated wafer-level solution involves fabricating caps using standard surface micro machining techniques. This approach consumes less area and the chip height is kept lower than if an independently manufactured cap is used. If the encapsulation is strong enough, the MEMS chip can be further packaged like a normal IC, which is cost effective. Furthermore this allows the possibility of integration with CMOS processes.

In a wafer level encapsulating process, the MEMS structure is built inside a cavity with an encapsulation shell using normal process steps. For most MEMS structures, for instance resonators, the Q-factor increases at lower pressures due to less air-damping. This means that one specification of the encapsulating shell is that it has to be hermetic to avoid the Q-factor decreasing over time.

A preferred deposition process for the capping layer would be PECVD deposition. However, most PECVD layers leak on the side-wall of the cavity when they are used as a capping layer.

Using low pressure chemical vapour deposition (LPCVD) layers can overcome this problem, but the different materials available give rise to different problems. The most commonly used LPCVD layers are TEOS, silicon nitride, poly-silicon and SiGe.

The disadvantage of TEOS is that it is etched in HF (Vapour-HF) rapidly, which is most commonly used as etchant for the sacrificial layer. Therefore, using TEOS as a capping layer leads to many extra and difficult process steps, as a result of the incompatibility with the etching process used for the sacrificial layer.

The etch rate of silicon nitride layers in HF is less but this leaves etch residues if vapour-HF is used. Vapour HF is particularly used for releasing of MEMS structures because there is almost no water involved and the amount of water can be controlled. Water can cause stiction when the resonator is dried afterwards. When liquid HF is used, this stiction has to be overcome by a special drying process.

Layers such as polysilicon and SiGe are almost not affected by HF or vapour-HF but are conductive and interfere with the MEMS-device performance if the space between the cap and MEMS device is limited. Moreover, if a conductive layer is used, an extra mask is needed to isolate the different bond pads.

This invention relates to an improved integrated approach for forming MEMS device packaging.

According to the invention, there is provided a method of manufacturing a MEMS device, comprising:
- forming a MEMS device element;
- forming a patterned sacrificial layer over the device element;
- forming a spacer layer over the sacrificial layer;
- etching the spacer layer to define spacer portions adjacent an outer side wall of the sacrificial layer and remove the spacer layer entirely from the top of the sacrificial layer;
- forming a package cover layer over the sacrificial layer and spacer portions;
- defining at least one opening in the package cover layer;
- removing the sacrificial layer through the at least one opening (24;38), thereby forming a package space over the device element; and
- sealing the at least one opening.

This method provides a way of forming a closed cavity over a MEMS device element, using standard fabrication processes. The spacer layer provides improved hermetic sealing around the side walls of the cavity, which improves the lifetime of the device. This means the cap layer can be deposited by PECVD, and the material can be chosen without taking into account any side wall leakage issues. For example the cover layer material can be chosen to have very low conductivity so that the electrical performance of the MEMS device is not compromised. Furthermore, the cover layer can be chosen to cause least problems when subjected to the desired sacrificial layer etching process. Any potential side wall leakage issues are resolved by the additional spacer portions.

The spacer layer can be formed by an LPCVD process and the spacer layer etching can comprise plasma etching. This means that no additional mask step is required to pattern the spacer portions.

The sacrificial layer can comprise an oxide layer, for example silicon oxide. This can be removed by a standard HF process, preferably with HF vapour etching.

The package cover layer can be deposited by a PECVD process and may for example comprise silicon carbon nitride (SiCN). This has low conductivity and therefore does not affect the electrical performance of the underlying MEMS device.

The invention also provides a packaged MEMS device, comprising:
a MEMS device element;
a cavity above the MEMS device element, wherein the cavity has a spacer portion around its periphery;
a package cover layer, provided over the cavity and the spacer portion; and
a sealed sacrificial-etch opening in the package cover layer.

Examples of the invention will now be described with reference to the accompanying drawings, in which.

The invention provides a method of manufacturing a MEMS device in which a closed cavity is formed over the MEMS device element. The cavity has side walls in addition to the packaging cover layer.

Figure 1:
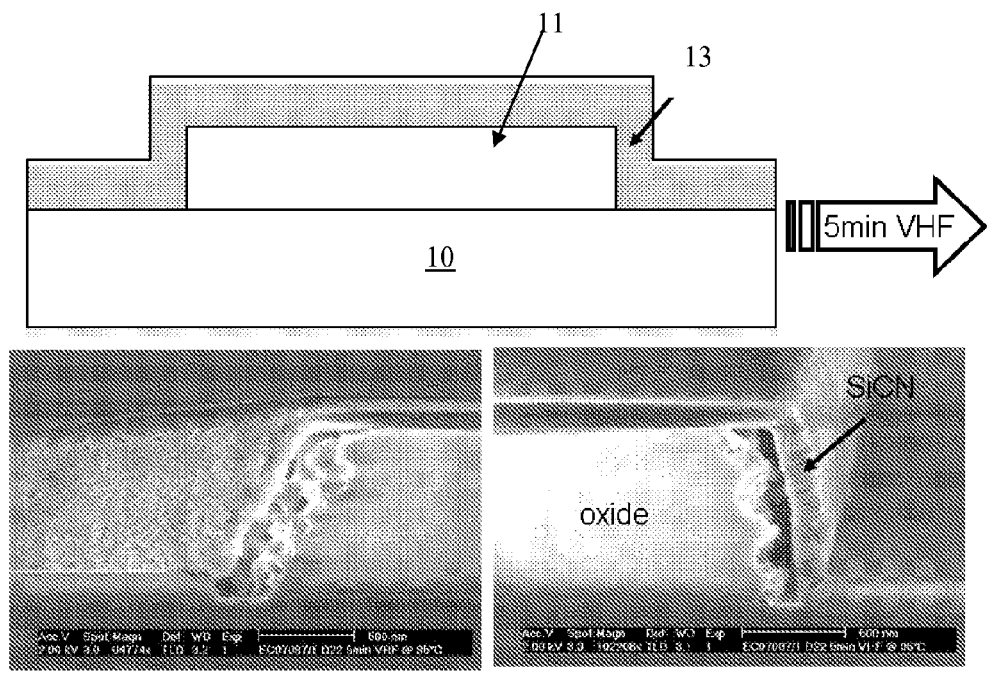
FIG. 1 is used to explain a problem with the side walls of a wafer level encapsulation process.

FIG. 1 is used to explain a problem with the side walls of a wafer level encapsulation process.

FIG. 1 shows an example structure of a substrate 10, oxide layer 11 and capping layer 13 in the form of a SiCN layer formed by PECVD. The oxide layer 11 represents a cavity and is used to enable the penetration through the capping layer 13 to be shown.

The bottom part of FIG. 1 shows two cross-section SEM (scanning electron microscope) pictures of the same stack after an exposure to HF-vapour for 5 minutes. The left and the right images show different rotation angles. The left image gives a better view of the sidewall of the SiCN which seems to be rough (porous). The right image gives a better view that the oxide on the sidewall is removed by vapour-HF. Thus, it can be seen that the HF etching seriously attacks the oxide on the sidewall of the structure. This means that the SiCN is not hermetic enough on the sidewall to prevent the HF from travelling through.

Figure 2:
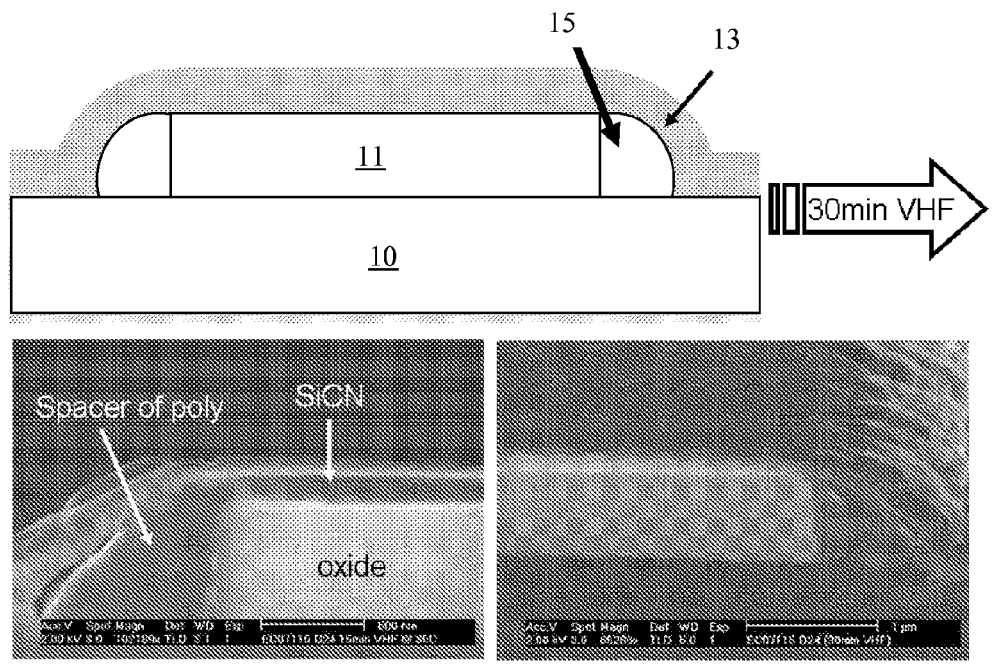
FIG. 2 is used to explain the concept underlying the invention.

FIG. 2 is used to explain the concept underlying the invention. The example structure has the substrate 10, oxide 11 and capping layer 13, again in the form of a SiCN layer formed by PECVD. In addition, a spacer side wall 15 of polysilicon is formed around the outside of the cavity defined by the oxide 10.

The bottom part of FIG. 2 again shows two cross section SEM pictures of the same stack after an exposure to HF-vapour for 30 min. It can be seen that there is no oxide removed, so the polysilicon spacer prevents the HF from etching the sidewall of the oxide.

The invention is based on the use of this additional spacer layer to provide improved hermetic sealing of the cavity side wall.

Figure 3:
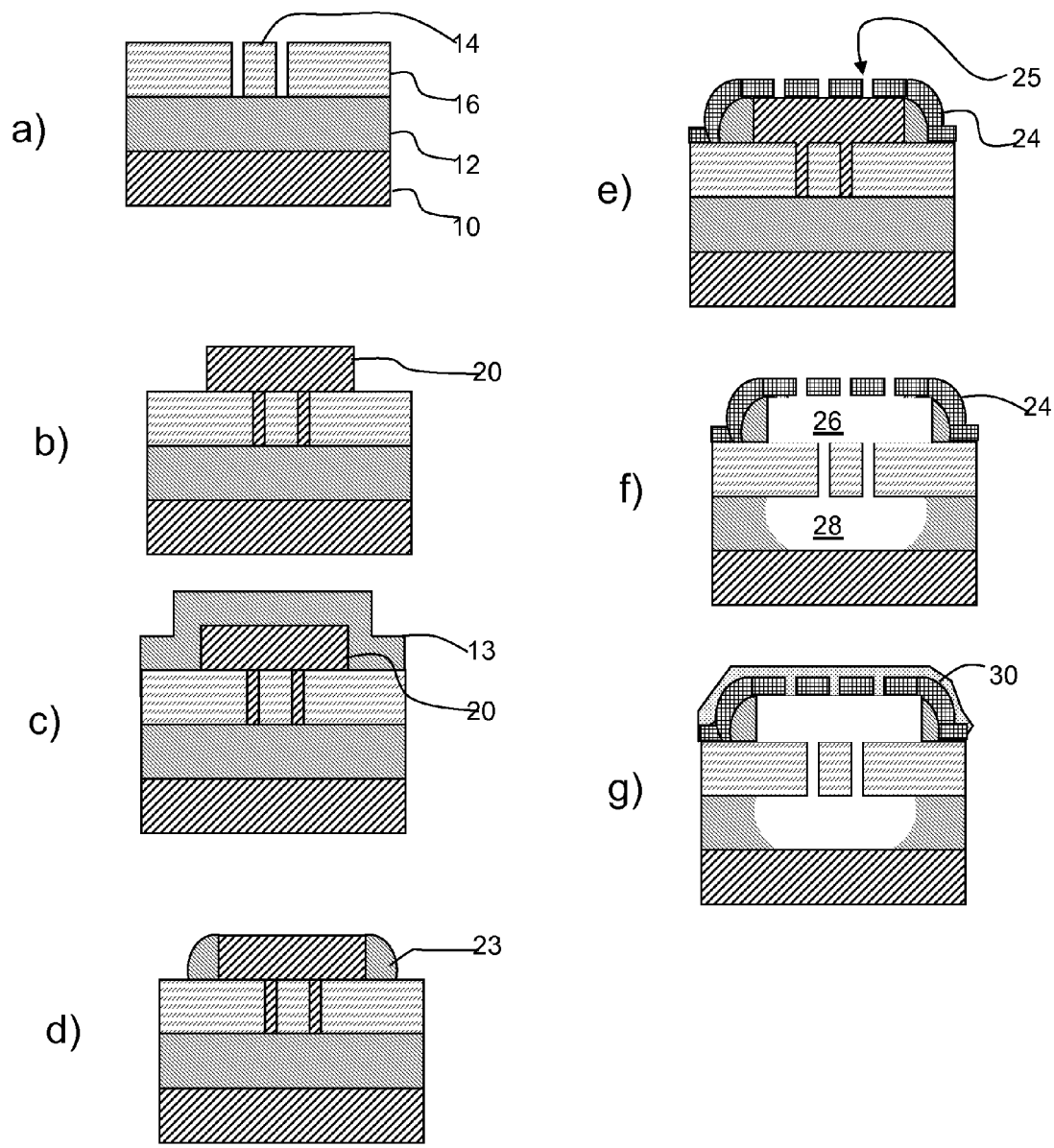
FIG. 3 shows an example of the manufacturing process in accordance with the invention as well as a finished MEMS device of the invention.

FIG. 3 shows schematically the method of the invention.

FIG. 3a shows a completed surface-micro machined device, in the form of a resonator in this example. The device comprises the silicon substrate 10, a silicon oxide layer 12 which will be used to form a cavity beneath the resonator mass, and the resonator mass 14 formed in a silicon layer 16.

The manufacture of the MEMS device does not need to be altered by this invention, and any conventional techniques can be used. The MEMS device can be a resonator, capacitor or switch, for example. Typically, the device has a movable portion which needs to be carefully protected by the packaging—in this example the device has a suspended resonator mass 14.

A sacrificial layer 20 is deposited and patterned to form an island over the MEMS device, as shown in FIG. 1b. This is also formed from silicon oxide so that the sacrificial layer 20 and the layer 12 are etched by the same process.

The sacrificial layer can be a different material, and does not have to be removed by vapour HF. For example, it could be a polymer removed by an oxygen plasma.

FIG. 1c shows the formation of a spacer layer, for example formed from polysilicon, polycrystalline SiGe or other LPCVD layer. The spacer is plasma etched to form spacer portions 23 around the outer lateral periphery of the sacrificial layer 20 as shown in FIG. 1d. These spacer portions 23 thus surround the outer side wall of the sacrificial layer, and thereby define the outer periphery of the cavity area (after removal of the sacrificial layer).

The spacer layer is removed entirely from the top of the sacrificial layer, so that is not over the MEMS device (beam 14) and thereby does not influence the electrical characteristics of the device. The plasma etching is a mask-less step, so that the additional processing cost is small.

A packaging cap layer 24 of poly-silicon is deposited for the formation of the encapsulation shell, and release holes 25 are patterned as shown in FIG. 1e. A PECVD process is used.

Removal of the sacrificial layer 20, through the release holes 25, is provided, to release the mechanical micro structures as shown in FIG. 1f. This defines a cavity 26 over the MEMS device. This also removes a portion of the silicon oxide layer 12 to form a second cavity 28 underneath the MEMS device. However, this second cavity could be formed by a separate process as part of the formation of the structure shown in FIG. 1a. In this case, the layers 12 and 20 would be different, and the sacrificial etching would remove only the layer 20. Of course, this would need different etch chemistry for the two layers 12,20, or else the sacrificial layer would have to be deposited over an already released MEMS structure.

The etching release holes 25 are then sealed by a cover sealing layer 30 to give the structure shown in FIG. 1g. This can be a PVD (physical vapour deposition) layer such as Aluminium. The sealing layer is applied at a low pressure so that the cavity is sealed at the desired low pressure.

The additional step introduced by the invention is a mask-less step, so that little additional expense is introduced into the process flow. The spacer can be formed from standard materials used as spacer etches in semiconductor manufacturing.

One main application of the invention is MEMS resonators. These resonators can be used to substitute crystal oscillators for timing reference purposes.

The capping layer has been described above as SiC. If a different release etch is used, other materials are suitable, such as SiN, SiO2. Also PVD layers like Al can be used. PVD layers normally have a poor step coverage and will also leak at the sidewall, so that the invention facilitates use of such materials.

Various other modifications like gyroscopes and accelerometers will be apparent to those skilled in the art.

The invention claimed is:
1. A method of manufacturing a MEMS device, comprising:
forming a MEMS device element including a movable portion, the MEMS device element being at least one of a resonator, a capacitor, and a switch;
forming a patterned sacrificial layer over the device element;
forming a spacer layer over the sacrificial layer;

etching the spacer layer to define a plurality of spacer portions adjacent an outer side wall of the sacrificial layer and remove the spacer layer entirely from a top of the sacrificial layer;

forming a package cover layer over the sacrificial layer and spacer portions;

defining at least one opening in the package cover layer;

removing the sacrificial layer through the at least one opening, thereby forming a package space over the device element; and sealing the at least one opening.

2. A method as claimed in claim 1, wherein the spacer layer is formed by a LPCVD process.

3. A method as claimed in claim 2, wherein the spacer layer etching comprises plasma etching.

4. A method as claimed in claim 1, wherein the sacrificial layer comprises an oxide layer.

5. A method as claimed in claim 4, wherein the sacrificial layer comprises silicon oxide.

6. A method as claimed in claim 1, wherein the package cover layer is deposited by a PECVD process.

7. A method as claimed in claim 6, wherein the package cover layer comprises SiCN.

8. A method as claimed in claim 1, wherein removing the sacrificial layer comprises a HF-vapour process.

9. A method as claimed in claim 1, wherein the MEMS device element includes a resonator.

10. A packaged MEMS device, comprising:
 a MEMS device element including a movable portion, the MEMS device element including at least one of a resonator, a capacitor, and a switch;
 a cavity above the MEMS device element, wherein the cavity has a spacer portion around its periphery;
 a package cover layer, provided over the cavity and the spacer portion;
 a sealed sacrificial-etch opening in the package cover layer; and
 wherein the package cover layer comprises SiCN.

11. A device as claimed in claim 10, wherein the spacer portion comprises at least one of polycrystalline silicon and polycrystalline silicon-germanium.

12. A device as claimed in claim 10, further comprising a sealing layer over the package cover layer.

13. A device as claimed in claim 10, wherein the MEMS device element includes a resonator.

14. A device as claimed in claim 10, wherein the MEMS device element includes a capacitor.

15. A device as claimed in claim 10, wherein the MEMS device element includes a switch.

16. A device as claimed in claim 10, wherein the MEMS device element is a resonator that includes a mass which is suspended between cavities.

17. A device as claimed in claim 10, wherein the MEMS device element is a capacitor that includes a mass which is suspended between cavities.

18. A device as claimed in claim 10, wherein the MEMS device element is a switch that includes a mass which is suspended between cavities.

19. A packaged MEMS device, comprising:
 a MEMS device element including a movable portion;
 a cavity above the MEMS device element, wherein the cavity has a spacer portion around its periphery, wherein the MEMS device element include a mass that is suspended with the cavity on at least one side thereof;
 a package cover layer, provided over the cavity and the spacer portion;
 a sealed sacrificial-etch opening in the package cover layer; and
 wherein the package cover layer comprises SiCN.

* * * * *